(12) United States Patent
Wang

(10) Patent No.: US 10,164,425 B2
(45) Date of Patent: Dec. 25, 2018

(54) ELECTROSTATIC DISCHARGE PROTECTION

(71) Applicant: NXP B.V., Eindhoven (NL)

(72) Inventor: Ge Wang, Chandler, AZ (US)

(73) Assignee: NXP B.V., Eindhoven (NL)

( * ) Notice: Subject to any disclaimer, the term of this patent is extended or adjusted under 35 U.S.C. 154(b) by 284 days.

(21) Appl. No.: 15/083,699

(22) Filed: Mar. 29, 2016

(65) Prior Publication Data

US 2017/0288397 A1    Oct. 5, 2017

(51) Int. Cl.
*H02H 9/04*    (2006.01)
*H01L 27/02*    (2006.01)

(52) U.S. Cl.
CPC ......... *H02H 9/046* (2013.01); *H01L 27/0266* (2013.01)

(58) Field of Classification Search
CPC ............................ H02H 9/046; H01L 27/0266
See application file for complete search history.

(56) References Cited

U.S. PATENT DOCUMENTS

| | | | |
|---|---|---|---|
| D224,882 S | 10/1972 | Alpern | |
| 5,517,379 A | 5/1996 | Williams et al. | |
| 5,771,140 A * | 6/1998 | Kim | H02H 9/046 361/111 |
| 6,191,606 B1 * | 2/2001 | Ye | H03K 19/0016 326/102 |
| 6,738,242 B1 * | 5/2004 | Kwong | H02H 9/046 361/56 |
| 7,098,513 B2 | 8/2006 | Chatty et al. | |
| 7,268,398 B1 | 9/2007 | Vashchenko et al. | |
| 8,067,996 B2 | 11/2011 | Hillman et al. | |
| 2005/0224882 A1 | 10/2005 | Chatty et al. | |
| 2007/0139836 A1 | 6/2007 | Ueda | |
| 2009/0130874 A1 * | 5/2009 | Englund | H01R 13/645 439/131 |
| 2013/0063844 A1 | 3/2013 | Sun | |

FOREIGN PATENT DOCUMENTS

EP    0854555 A2    7/1998

OTHER PUBLICATIONS

Ming-Dou Ker et al., "ESD Implantations for On-Chip ESD Protection with Layout Consideration in 0.18-um Salidided CMOS Technology", IEEE Transactions on Semiconductor Manugacturing, vol. 18, No. 2, May 2005.
Ker, Ming-Dou, et al. "Impact of layout pickups to ESD robustness of MOS transistors in sub 100-nm CMOS process." Next-Generation Electronics (ISNE), 2010 International Symposium on. IEEE, 2010.
Extended European Search Report for Patent Appln. 17158886.6 (dated Jul. 26, 2017).

* cited by examiner

*Primary Examiner* — Scott Bauer

(57) ABSTRACT

Circuits and methods concerning voltage surge protection are disclosed. In an example embodiment, an apparatus includes a switching circuit configured to enable a current path between a first node and a second node in a first mode and disable the current path in a second mode. A biasing circuit configured to, in the surge protection mode, prevent a voltage surge at the first node from enabling the current path to the second node by biasing a voltage of the control node.

19 Claims, 3 Drawing Sheets

ELECTROSTATIC DISCHARGE PROTECTION

OVERVIEW

Aspects of various embodiments are directed to providing electrostatic discharge protection for electronic circuits. Electrostatic discharge (ESD) may be caused by the sudden flow of electricity that occurs when structures of differing voltage potential become close enough for dielectric between them to break down and facilitate transfer of energy. The differing voltage potential may be created, for example, by the buildup of static electricity between one of the structures (e.g., a cable). One type of ESD, referred to as a cable discharge event or surge event, occurs when charge is transferred from a cable connected to a device. For example, a surge event may occur when a cable that is statically charged to a different potential is connected to a device. When this happens, charge transfers into or out of the device as the voltage potential is reduced. ESD events can damage integrated circuits (ICs) through their connector interfaces. These and other matters have presented challenges to efficiencies of ESD protection implementations, for a variety of applications.

SUMMARY

Various example embodiments are directed to issues such as those addressed above and/or others which may become apparent from the following disclosure concerning electronic circuits. In certain example embodiments, aspects of the present disclosure involve circuits and methods for protecting against voltage surges in electronic devices.

In certain embodiments, an apparatus includes a switching circuit configured to enable a current path between a first node and a second node in a first mode (e.g., a charging mode) and disable the current path in a second mode (e.g., a surge protection mode). The apparatus further includes a biasing circuit configured to, in the second mode, prevent a voltage surge at the first node from enabling the current path to the second node by biasing a voltage of the control node.

In a more specific example embodiment, the switching circuit is configured to operate in the first mode in response to a voltage of a control node relative to a voltage of the first node exceeding a threshold voltage and operate in the surge protection mode in response to the voltage of the control node relative to the voltage of the first node being less than the threshold voltage. In the surge protection mode, the switching circuit is configured and arranged disable to prevent a voltage surge at the first node reaching the second node. However, negative surge at the first node may increase the voltage difference between the first node and control node in excess of the threshold voltage and thereby cause the switching circuit to enable the current path. The biasing circuit is configured to prevent a negative surge at the first node from enabling the current path to the second node by biasing the control node to reduce the voltage of the control node.

In another example embodiment, a method is provided for providing surge protection between first and second nodes. In a first mode, a current path between the first and second nodes is enabled. The current path is enabled by setting a control node of a switching circuit electrically connected in the current path to a first voltage. In a second mode, the current path is disabled by setting the control node to a second voltage. In response to a voltage surge at the first node in the second mode, the switching circuit is prevented from enabling the current path by biasing the voltage of the control node.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which.

Figure 1:
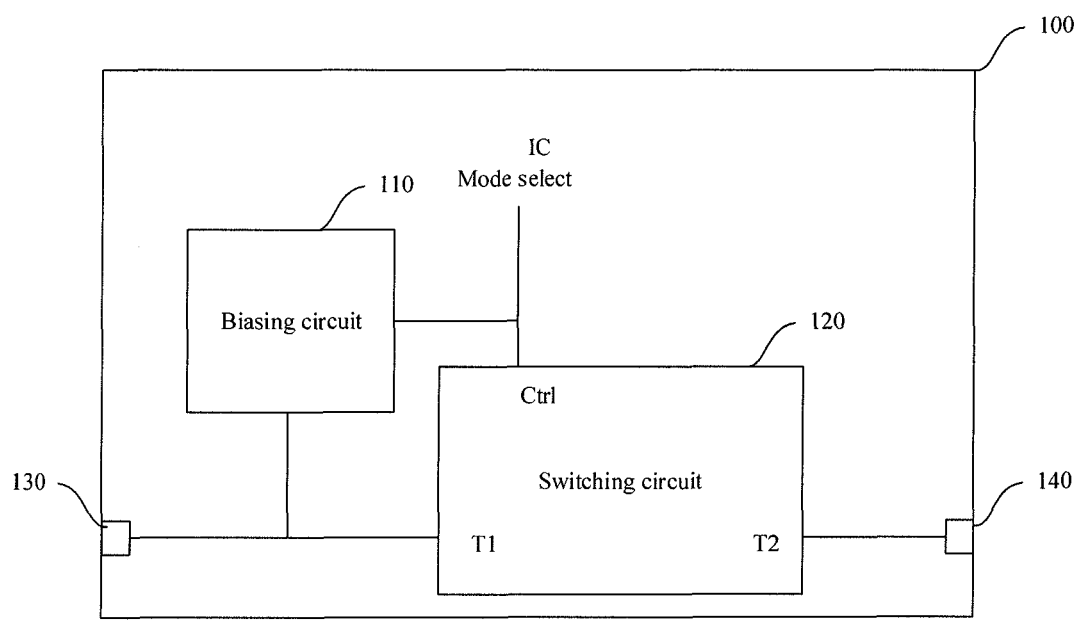
FIG. 1 depicts a block diagram of an example circuit for protection against surge events, consistent with embodiments of the present disclosure.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems, and methods involving electronic circuits. In certain implementations, aspects of the present disclosure have been shown to be beneficial when used in the context of surge protection for electronic circuits. While not necessarily so limited, various aspects may be appreciated through the following discussion of non-limiting examples which use exemplary contexts.

Methods and circuits are disclosed for protection against positive and/or negative surge events. In certain embodiments, a surge protection circuit includes a switching circuit configured to enable a current path between a first node and a second node in a first mode (e.g., a charging mode) and disable the current path in a second mode (e.g., a surge protection mode). In certain embodiments, the switching circuit is susceptible to inadvertent enabling of the current path in the second mode in response to a surge event which occurs at the first node. The surge protection circuit includes a biasing circuit configured to reduce susceptibility of the switching circuit to the surge event, for example, by biasing a voltage of a node in the switching circuit.

For some applications, such circuits and methods are used to protect circuitry from positive and/or negative surge events. In a positive voltage surge, a voltage of a node may be shifted above an operating voltage range of a circuit (e.g., greater than a supply voltage). In a negative voltage surge, a voltage of a node may be shifted below the operating voltage range of an integrated circuit (e.g., less than a ground voltage). Certain applications may protect against positive surge events, for example, using a front-end circuit including on-chip ESD protection circuits and/or external transient voltage suppression diodes. However, it can be more difficult to against negative surge events, in which a current/voltage pulse may enter from one touched pin of an IC and exit from another pin of the IC. Certain applications benefitting from aspects of the disclosure reduce susceptibility against such negative surge events.

As an illustrative example, the switching circuit may include an N-type metal-oxide-semiconductor field-effect transistor (NMOS) transistor required to be off in the second mode in order to ensure correct operation. The NMOS transistor may have a source electrically connected to a node at which a voltage surge is presented. If the voltage surge is positive, the source voltage rises and the gate-source voltage is reduced. As a result, the gate-source voltage remains below the threshold voltage and the NMOS transistor remains in an off state. However, if the voltage surge is negative, the source voltage is decreased and the gate-source voltage is increased. If the gate-source voltage becomes greater than the threshold voltage, the NMOS transistor will switch on and surge may transfer between the first and second nodes.

In various embodiments, the biasing circuit is configured to prevent the surge event from disrupting correct operation of the switching circuit. For instance, continuing with the above NMOS example, the biasing circuit may be configured to bias a gate of the NMOS transistor when a negative surge occurs to ensure the gate-source voltage remains below the threshold voltage. In this manner, the switching circuit can prevent the negative surge from transferring between the first and second nodes.

Accordingly, in the following description various specific details are set forth to describe specific examples presented herein. It should be apparent to one skilled in the art, however, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element. Also, although aspects and features may in some cases be described in individual figures or embodiments, it will be appreciated that features from one figure can be combined with features of another figure or embodiment even though the combination is not explicitly shown or explicitly described as a combination.

In different embodiments, the switching and biasing circuits may be implemented using various circuits. The circuits may be implemented, for example, using various types of transistor technologies including but not limited to bipolar-junction transistors (BJTs), junction field-effect transistors (JFETs), and/or metal-oxide-semiconductor field-effect transistors MOSFETs. While not so limited, for ease of explanation, the examples are primarily discussed with reference to MOSFETs.

The disclosed circuits and methods may be useful in various applications to protect against voltage surges. For example, a surge protection circuit may be configured to protect against voltage surges that occur when a power cable (e.g., a USB power line) or a signal line is initially connected to a device. For instance, a surge protection circuit may be used to isolate a USB power line interface connected to a first node from a second node connected to a battery of a device when the USB cable is initially connected. After the cable has been connected and any surge discharged, the surge protection circuit may provide a current path from the power line interface to the battery for charging. As another example, a surge protection circuit may be used to isolate circuits of a device from a data signal line interface of the device (e.g., a headphone jack) when the data signal line is initially connected. A surge protection circuit may additionally or alternatively be configured for protection against voltage surges that are generated on a connected cable during operation, for example, by static electricity, shorted circuit, or lighting strike. For ease of explanation, the examples are primarily discussed in the context of protecting against voltage surge generated when a power cable is connected to a node of a device.

Turning now to the figures, FIG. 1 shows an integrated circuit (IC) 100 having a switching circuit connected between a first node 130 and a second node 140. In this example, the switching circuit 120 is configured to enable a current path between the first node 130 and the second node 140 in response to a mode select signal provided to a control node (Ctrl) indicating a first mode (e.g., a charge/power mode) and disable the current path in response to the mode select signal indicating a second mode (e.g., a surge protection mode).

As previously described, the switching circuit 120 may be susceptible to one type of surge event (e.g., positive or negative voltage surges). For instance, when a negative voltage surges occur, the switching circuit 120 may be unable to keep the current path disabled, and thereby may allow current to flow from node 140 to node 130. A biasing circuit 110 is configured to prevent a voltage surge at the first node from enabling the current path while the switching circuit is operated in the second mode. For example, if the switching circuit 120 is susceptible to negative voltage surges, the biasing circuit 110 may be configured to bias the control node Ctrl of the switching circuit 120 in response to detecting a negative surge event at the first node 130. The bias circuit 110 may detect a negative surge event based on a comparison of the voltage of the first node 130 to a reference voltage (e.g., GND). Conversely, if the switching circuit 120 is susceptible to positive voltage surges, the biasing circuit 110 may be configured to bias the control node Ctrl of the switching circuit 120 in response to detecting a positive surge event at the first node 130. The bias circuit 110 may detect a positive surge event based on a comparison of the voltage of the first node 130 to a reference voltage (e.g., Vdd).

In a more specific example embodiment, the switching circuit 120 is configured to enable/disable the current path between the first and second nodes 130 and 140 is based on a comparison of a voltage difference between the control node Ctrl and the first node 130 to a threshold voltage. For instance, the switching circuit 120 may include a transistor having a gate electrically connected to the control node and a source or drain electrically connected to the first node 130. Voltage change induced by a surge event at the first node may shift a voltage of source or drain of the transistor and thereby change the voltage of the gate relative to a voltage of the source/drain of the transistor. The biasing circuit 110 may be configured to bias the voltage of the control node to prevent a voltage difference between the source and gate from exceeding a threshold voltage at which the transistor begins to pass current. In this manner, the surge event is prevented from causing the transistor from turning on and enabling the current path between the first and second nodes 130 and 140.

Figure 2:
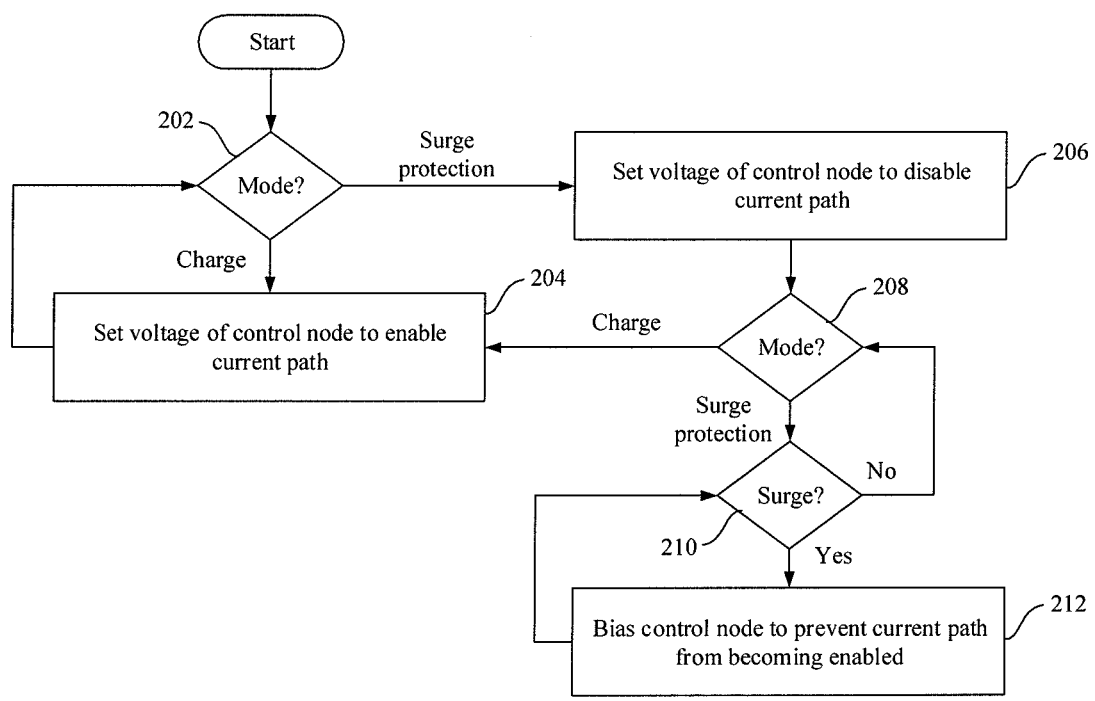
FIG. 2 depicts a flowchart of an example process for protection against surge events, consistent with embodiments of the present disclosure.

FIG. 2 depicts a flowchart of an example process for protection against surge events, consistent with embodiments of the present disclosure. The process is initially directed to decision block 202 when the process is started. If a selection signal indicates charge mode at decision block 202, a current path is enabled by setting a voltage of a control node (e.g., of switching circuit 120) to a first value at block 204. If or when the selection signal is set to indicate a surge protection mode at decision block 202, the current path is disabled by setting a voltage of the control node to a second value at block 206. While the mode selection circuit indicates the surge protection mode, the process is directed from decision block 208 to decision block 210. If a surge is present at decision block 210, the control node is biased at block 212 (e.g., by biasing circuit 110) to prevent the current path from becoming enabled. When the surge is no longer present, the process is directed back to decision block 208. If or when the selection signal is set to charge mode, the current path is enabled by setting the voltage of the control node to the first value at block 204. The process continues in this manner until the device is reset or powered down.

Figure 3:
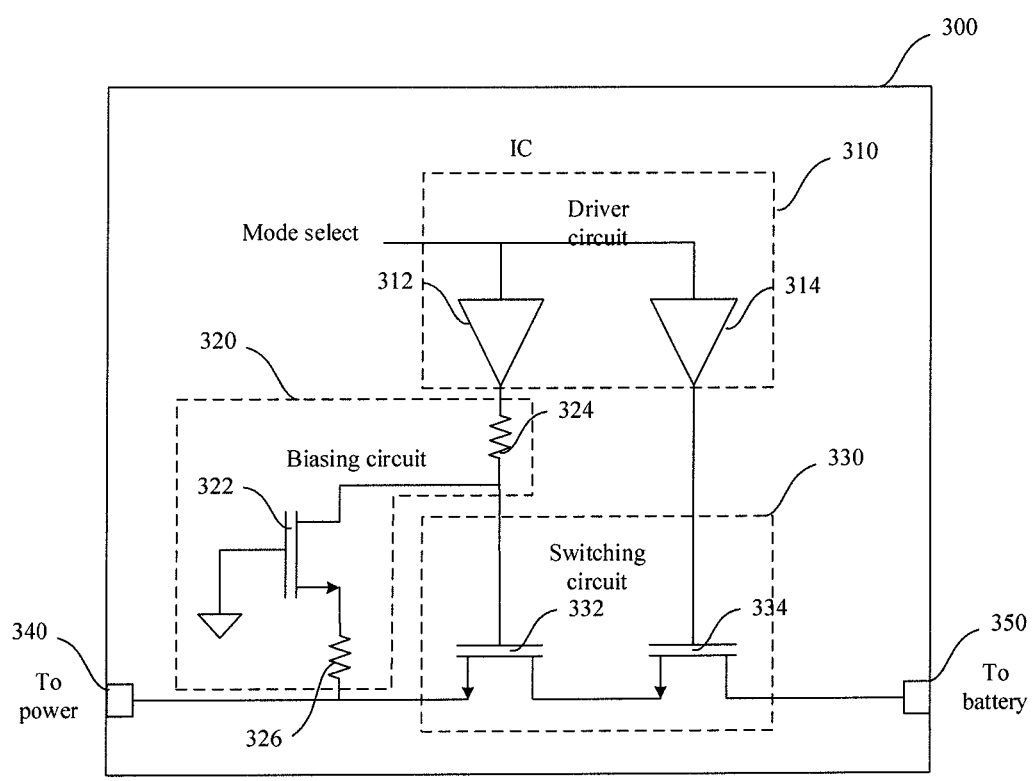
FIG. 3 depicts a circuit diagram of an example circuit for protection against surge events, consistent with embodiments of the present disclosure.

As previously discussed, the switching and biasing circuit of a surge protection circuit may be implemented using various circuit arrangements. FIG. 3 depicts a circuit diagram of an example circuit arrangement for protection against surge events on an IC 300, consistent with embodiments of the present disclosure. The circuit arrangement includes a first node 340, a second node 350, a biasing circuit 320, and a switching circuit 330 configured and arranged as described with reference to the first node 130, the second node 140, the biasing circuit 110, and a switching circuit 120 in FIG. 1. The switching circuit 330 includes a number of transistors 332 and 334 arranged to provide a current path between the first and second nodes 340 and 350 responsive to a mode select signal.

In this example, the switching circuit 330 includes two NMOS transistors 332 and 334 connected together in series between the first node 340 and the second node 350. However, embodiments are not so limited. For instance, the switching circuit 330 may be adapted to provide the current path using a single transistor connected between the first and second nodes 340 and 350 or using three or more transistors connected in a series between the first and second nodes. Using multiple series connected in series reduces the sub-threshold leakage current of the current path. Generally, sub-threshold leakage current reduces at an exponential rate as the number of transistor connected in series is increased. In testing of some example implementations, two 25 mOhm NMOS transistors connected in series were determined to exhibit a sub-threshold leakage of approximately 0.1 mA, which is sufficient for many applications.

Each of the NMOS transistors 332 and 334 has a gate connected to receive the mode select signal. In this example, the IC 300 includes a driver circuit 310 configured to provide the mode select signal to gates of the transistors 332 and 334 of the switching circuit 330. The driver circuit 310 in this example includes a respective driver sub-circuit 312 and 314 for each of the transistors 332 and 334.

When the mode select signal is set at a high voltage (e.g., logic 1), the switching circuit is operated in a first mode (e.g., a charging mode), NMOS transistors 332 and 334 are turned on, and the current path is enabled. Conversely, when the mode select signal is set a low value (e.g., logic 0), the switching circuit is operated in a second mode (e.g., a surge protection mode), where transistors 332 and 334 are turned off and the current path is disabled. The switching circuit may be operated in the second mode to prevent surge events occurring at node 340, for example, when a power or data cable is initially connected to node 340, from transferring to node 350.

In this example, the switching circuit 330 is resistant to positive surge events when operated in the second mode. When a positive surge event occurs at node 340, source voltage of the transistor 332 increases, thereby decreasing the gate-source voltage of the transistor 332. As a result, the gate-source voltage remains below the threshold voltage and the NMOS transistor remains in an off state. The surge current of the positive surge event may be bypassed by one or more additional circuits (not shown in FIG. 3) that may be connected to node 340 including, for example, on-chip ESD protection circuits and/or external transient voltage suppression diodes. Conversely, when the voltage surge is negative, the source voltage is decreased and the gate-source voltage is increased. If the gate-source voltage becomes greater than the threshold voltage, the NMOS transistor will switch on and allow the voltage surge to transfer to the transistor 334. The negative surge may similarly cause transistor 334 to switch on and allow the surge to transfer to node 350.

Biasing circuit 320 is configured to bias the control node of the switching circuit to prevent transistor 332 from switching on when negative voltage surge occurs at node 340. In this example, the biasing circuit 320 includes a NMOS transistor 322 connected in a current path between the gate of transistor 332 and node 340. The biasing circuit 320 includes a resistor 324 connecting the gate of the transistor 322 to the driver circuit 310. The biasing circuit 320 also includes a resistor 324 connecting the source of transistor 322 to the node 340. The gate of transistor 322 is connected to a lower operating voltage of the IC (e.g., Gnd). During normal operation, transistor 322 is turned off since its gate voltage is tied to Gnd. When negative voltage surge occurs at node 340, source voltage of transistor 322 is pulled well below Gnd. When the gate-source voltage exceeds a threshold voltage of the transistor 322, the transistor 322 turns on and provides a current path from the gate of transistor 332 to node 340. While the transistor 322, resistors 324 and 326 form a resistive bridge. Voltage drop across resistor 324 pull the gate voltage of transistor 332 to a low voltage sufficient to prevent the transistor 332 from turning on. In this manner, the switching circuit is able to prevent negative surges from transferring from node 340 to node 350.

The voltage drop across resistor 324 depends on the resistance of the resistor 324 relative to the resistance of resistor 326. In some embodiments, the resistors may be selected to have resistivity values sufficient to cause the voltage a drop across resistor 324 to consume the entire operating voltage range of the IC (e.g., Vdd-Gnd). As one consideration, it is noted that the ability of the driver 310 to provide the mode select signal to transistor 332 may be adversely affected if the resistance of resistor 324 is too high. Simulation and testing of some example circuits have shown that a 4 kOhm resistor 324 and a 20 Ohm resistor 326 provides sufficient voltage drop across resistor 324 without negatively affecting performance during normal operation.

The circuit arrangement in FIG. 3 has been shown to successfully prevent transfer of both negative surges well outside typical operating voltage ranges for many electronic circuits. For instance, simulation and testing of example implementations of the switching and biasing circuits have been shown to block +/−20V surges generated according to the International Electrotechnical Commission (IEC) 61000-4-5 standard.

In different applications, a mode select signal may be controlled to switch between charging and surge protection modes at various times to protect against surge events. In some embodiments, the value of the mode select signal may be adjusted, for example by a logic circuit, to prevent transfer of voltage surges when a cable is initially connected. As an illustrative example, the logic circuit may set a mode select signal to cause the switching circuit to operate in surge protection mode until after connection of a cable is detected and any voltage surge has been suppressed. Connection/disconnection of the cable may be detected using various circuits and/or processes. For example, circuit pathway may be completed when a cable terminal is inserted into an input port. As another example, voltage provided by a power cable may be detected (e.g., based on a comparison with a reference voltage). In response to verifying that voltage surge is not present, the logic circuit may set the mode select signal to cause the switching circuit to operate in the charge mode.

The logic circuit may set the mode select signal to switch operation of the switching circuit back to the surge protection mode in response to various events. For example, in some implementations, the logic circuit may monitor voltage of a cable terminal and prompt the switching circuit to operate in the surge protect mode in response to the monitored voltage being indicative of a surge event. As another example, the switching circuit may be prompted to switch from the charging mode to the surge protection mode in response to a battery becoming fully charged or exceeding a rated temperature threshold. As yet another example, if disconnection of the cable is detected, the switching circuit may prompt the switching circuit to again operate in the surge protection mode so voltage surge will be blocked when the cable is reconnected at a later time.

The skilled artisan would recognize that various terminology as used in the Specification (including claims) connote a plain meaning in the art unless otherwise indicated. As examples, the Specification describes and/or illustrates aspects useful for implementing the claimed disclosure by way of various circuits or circuitry which may be illustrated as or using terms such as blocks, modules, device, system, unit, controller, control circuitry and/or other circuit-type depictions (e.g., reference numeral 110 of FIG. 1 depicts a block as described herein). Such circuits or circuitry are used together with other elements to exemplify how certain embodiments may be carried out in the form or structures, steps, functions, operations, activities, etc. For example, in certain of the above-discussed embodiments, one or more modules are discrete logic circuits, programmable logic circuits configured and arranged for implementing these operations/activities, or combinations thereof. In certain embodiments, such a programmable circuit is one or more computer circuits, including memory circuitry for storing and accessing a program to be executed as a set (or sets) of instructions (and/or to be used as configuration data to define how the programmable circuit is to perform), and an algorithm or process is used by the programmable circuit to perform various steps, functions, operations, activities, etc. Depending on the application, the instructions (and/or configuration data) can be configured for implementation in logic circuitry, with the instructions (whether characterized in the form of object code, firmware or software) stored in and accessible from a memory (circuit).

Based upon the above discussion and illustrations, those skilled in the art will readily recognize that various modifications and changes may be made to the various embodiments without strictly following the exemplary embodiments and applications illustrated and described herein. For example, methods as exemplified in the Figures may involve steps carried out in various orders, with one or more aspects of the embodiments herein retained, or may involve fewer or more steps. Such modifications do not depart from the true spirit and scope of various aspects of the disclosure, including aspects set forth in the claims.

What is claimed is:

1. An apparatus, comprising:
    a switching circuit configured and arranged to enable a current path between a first node and a second node in a first mode and disable the current path in a second mode;
    a biasing circuit configured to, in a second mode, prevent a voltage surge at the first node from enabling the current path to the second node by biasing a voltage of a control node,
    wherein the switching circuit is configured to
        operate in the first mode in response to a voltage of the control node relative to a voltage of the first node exceeding a threshold voltage, and
        operate in the second mode in response to the voltage of the control node relative to the voltage of the first node being less than the threshold voltage,
        wherein in the second mode the switching circuit is configured and arranged to disable the current path; and
    the biasing circuit configured to, in the second mode, prevent a negative surge at the first node from enabling the current path to the second node by biasing the control node to reduce the voltage of the control node.

2. The apparatus of claim 1, wherein
    the switching circuit includes a transistor having a source and a drain electrically connected in the current path and a gate electrically connected to the control node;
    the transistor is configured to enable the current path in response to a gate-source voltage exceeding the threshold voltage and disable the current path in response to the gate-source voltage being less than the threshold voltage; and
    the biasing circuit is configured to reduce the voltage of the gate, in response to the first node having a voltage below an operating voltage range of the switching circuit, by an amount sufficient to prevent the gate-source voltage from exceeding the threshold voltage.

3. The apparatus of claim 2, wherein
    the biasing circuit includes an n-type transistor having a drain electrically connected to the control node, a source electrically connected to the first node, and a gate electrically connected to a ground voltage.

4. The apparatus of claim 3, wherein
    the first mode corresponds to an operation of providing power and/or a charge current, and
    the second mode corresponds to an operation of providing surge protection.

5. The apparatus of claim 2, wherein the biasing circuit further includes
    a first resistor having a first end connected to the drain of an n-type transistor and a second end connected to an output of a driver circuit; and
    a second resistor having a first end connected to the source of the n-type transistor and a second end connected to the first node.

6. The apparatus of claim 1, wherein the switching circuit includes a first transistor and a second transistor connected together in series.

7. The apparatus of claim 6, wherein the first and second transistors are configured to exhibit a leakage current via the current path that is less than 0.1 mA.

8. The apparatus of claim 1, wherein the switching circuit includes three of more transistors connected together in series.

9. The apparatus of claim 1, wherein in the second mode the switching circuit is configured and arranged to prevent negative voltage surges of up to 20V at the first node from reaching the second node.

10. The apparatus of claim 1, further comprising a surge protection circuit including the switching and biasing circuits.

11. A mobile device, comprising:
a USB port having a power pin connected to the first node;
a battery coupled to the second node; and
a circuit protection circuit of claim 10.

12. A method, comprising:
in a first mode,
enabling a current path between a first node and a second node by setting a control node of a switching circuit electrically connected in the current path to a first voltage;
in a second mode,
disabling the current path between the first node and the second node by setting the control node to a second voltage; and
in response to a voltage surge at the first node, preventing the switching circuit from enabling the current path to the second node by using a biasing circuit for biasing the voltage of the control node; and
wherein the switching circuit is configured to
operate in the first mode in response to a voltage of the control node relative to a voltage of the first node exceeding a threshold voltage, and
operate in the second mode in response to the voltage of the control node relative to the voltage of the first node being less than the threshold voltage,
wherein in the second mode the switching circuit is configured and arranged to disable the current path; and
the biasing circuit configured to, in the second mode, prevent a negative surge at the first node from enabling the current path to the second node by biasing the control node to reduce the voltage of the control node.

13. The method of claim 12, wherein
the switching circuit includes at least one n-type transistor having a source and a drain electrically connected in the current path and a gate electrically connected to the control node,
the n-type transistor being configured to enable the current path in response to a gate-source voltage exceeding a threshold voltage and disable the current path in response to the gate-source voltage falling below the threshold voltage; and
the biasing of the voltage of the control node includes reducing the voltage of the control node by an amount sufficient to prevent a gate-source voltage from exceeding the threshold voltage.

14. The method of claim 12, wherein the biasing of the voltage is performed using an n-type transistor having
a drain electrically connected to the control node,
a source electrically connected to the first node, and
a gate electrically connected to a ground voltage.

15. The method of claim 12, further comprising,
operating in the second mode in response to a device including the switching circuit being powered on; and
in response to detecting connection of a power supply to the first node
determining whether voltage surge is present at the first node, and
operating in the first mode after determining that voltage surge is not present at the first node.

16. The method of claim 15, further comprising,
while operating in the first mode, charging a battery connected to the second node by providing current from the first node to the second node via the current path.

17. The method of claim 15, further comprising,
operating in the second mode in response to detecting a voltage surge while operating in the first mode.

18. The method of claim 15, further comprising,
while operating in the first mode, communicating data between the first node and the second node.

19. The method of claim 15, wherein
the switching circuit includes a first transistor and a second transistor coupled together in series in the current path; and
the first and second transistors are configured to exhibit a leakage current via the current path that is less than 0.1 mA.

* * * * *